United States Patent
Wang et al.

(10) Patent No.: US 7,434,092 B2
(45) Date of Patent: Oct. 7, 2008

(54) SEMICONDUCTOR MEMORY AND METHOD OF STORING CONFIGURATION DATA

(75) Inventors: Chih-Chieh Wang, Fremont, CA (US); Jonathan G. Pabustan, San Lorenzo, CA (US); Ben Sheen, Milpitas, CA (US)

(73) Assignee: Silicon Storage Techonology, Inc., Sunnyvale, CA (US)

( * ) Notice: Subject to any disclaimer, the term of this patent is extended or adjusted under 35 U.S.C. 154(b) by 502 days.

(21) Appl. No.: 11/063,316

(22) Filed: Feb. 22, 2005

(65) Prior Publication Data

US 2006/0190762 A1    Aug. 24, 2006

(51) Int. Cl.
*G06F 11/00* (2006.01)
(52) U.S. Cl. .................. 714/6; 714/5; 714/7; 714/8; 714/42
(58) Field of Classification Search .................. 714/5, 714/6, 7, 8, 42, 723; 365/200
See application file for complete search history.

(56) References Cited

U.S. PATENT DOCUMENTS

| | | | |
|---|---|---|---|
| 5,699,549 A * | 12/1997 | Cho ........................... 711/115 |
| 6,052,798 A * | 4/2000 | Jeddeloh ....................... 714/8 |
| 6,154,851 A * | 11/2000 | Sher et al. ...................... 714/5 |
| 6,219,768 B1 * | 4/2001 | Hirabayashi et al. ........... 714/6 |
| 6,327,680 B1 | 12/2001 | Gervais et al. |
| 6,336,176 B1 | 1/2002 | Leyda et al. |
| 6,826,712 B2 * | 11/2004 | Ono ............................... 714/6 |
| 6,910,152 B2 * | 6/2005 | Blodgett ........................ 714/6 |

* cited by examiner

*Primary Examiner*—Robert Beausoliel
*Assistant Examiner*—Joseph D Manoskey
(74) *Attorney, Agent, or Firm*—Edward S. Wright

(57) ABSTRACT

Redundantly repaired semiconductor memory and method in which the configuration data for the memory is stored in an area of the main memory array which is known to be free of bad bits, along with a signature code which serves as a pointer and verifies the validity of the configuration data. In one disclosed embodiment, the data is stored in a configuration memory which is divided into a plurality of areas of equal size and known starting addresses. The number of areas is greater than the number of permitted repairs, and the areas which do not contain defects are available for storing configuration data including device settings, repair information, and the like.

15 Claims, 3 Drawing Sheets

SEMICONDUCTOR MEMORY AND METHOD OF STORING CONFIGURATION DATA

BACKGROUND OF THE INVENTION

1. Field of Invention

This invention pertains generally to semiconductor memory devices and, more particularly, to a semiconductor memory and method of storing configuration data for the memory.

2. Related Art

Configuration data for semiconductor memory devices is typically stored in fuses or other volatile or non-volatile devices, e.g. registers, which are outside the main memory array. Such data is generated during the testing of the devices and may, for example, include wafer information, wafer sorting information, failed addresses, option control information, and other information which is utilized during start-up of the devices.

In order to increase manufacturing yields, many semiconductor memory devices include redundant areas or cells which can be used to replace defective portions of the array. This technique is sometimes referred to as redundancy repair, and in memory devices utilizing it, the redundancy repair information is included in the configuration data. The repair information is stored after all repairs have been made, and when reading information from the memory, the repair information needs to be ready before the actual array read. If the configuration data were stored in the main memory array, there is a chance that it could be written into a repaired area, and that it could not be read out correctly because the repair information which needs to be known in order to read it would not be available yet.

OBJECTS AND SUMMARY OF THE INVENTION

It is in general an object of the invention to provide a new and improved semiconductor memory and method of storing configuration data.

Another object of the invention is to provide a device and method of the above character in which the configuration data for the memory is stored in the main memory array.

These and other objects are achieved in accordance with the invention by storing the configuration data for a redundantly repaired semiconductor memory in an area of the main memory array which is known to be free of bad bits, along with a signature code which serves as a pointer and verifies the validity of the configuration data. In one disclosed embodiment, the data is stored in a configuration page which is divided into a plurality of areas of equal size and known starting addresses. The number of areas is greater than the number of permitted repairs, and the areas which do not contain bad bits are available for storing configuration data including device settings, repair information, and the like.

DETAILED DESCRIPTION

Figure 1:
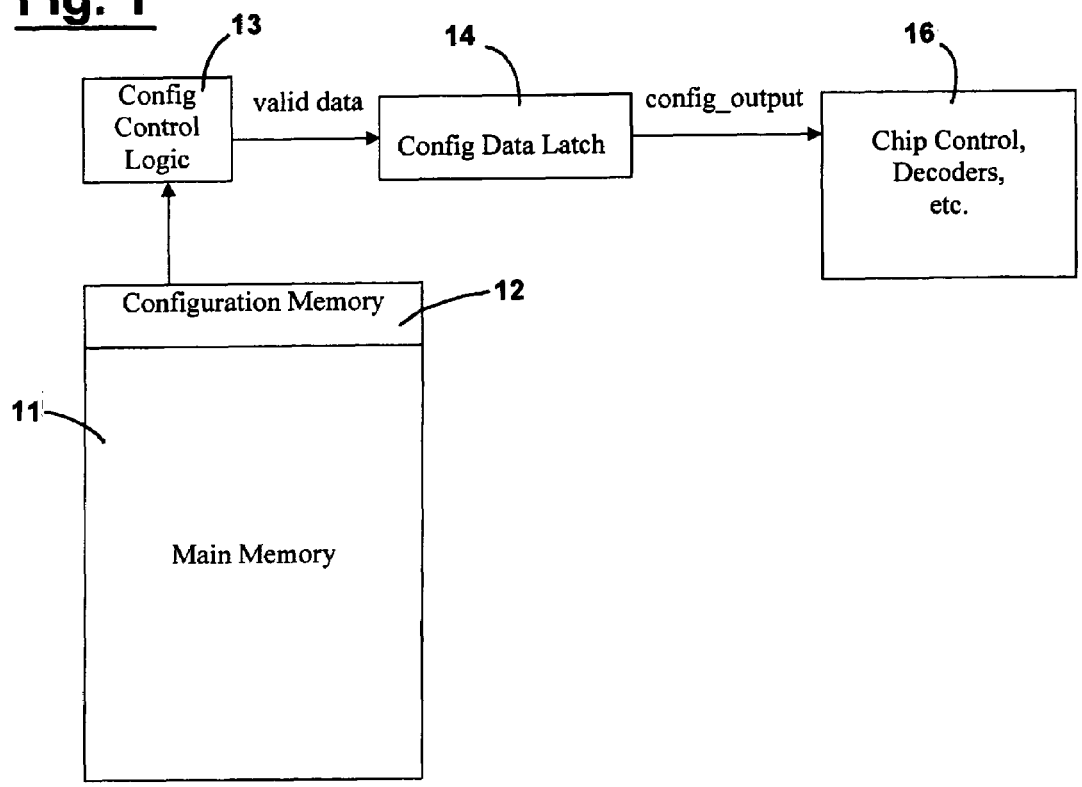
FIG. 1 is a block diagram illustrating one embodiment of a semiconductor memory according to the invention.

As illustrated in FIG. 1, the memory has a main array 11 which can be of conventional design with a plurality of storage cells or bits which are organized by rows and columns. The memory is redundantly repairable in that it includes redundant cells or bits which can be used to replace defective portions of the array.

A configuration page or row 12 is included in the main memory array. This page is divided into a plurality of areas of equal size and known starting addresses, with the number of areas preferably being one greater than the number of repairs which can be made in the array. Configuration data is stored in one of the areas.

Figure 2:
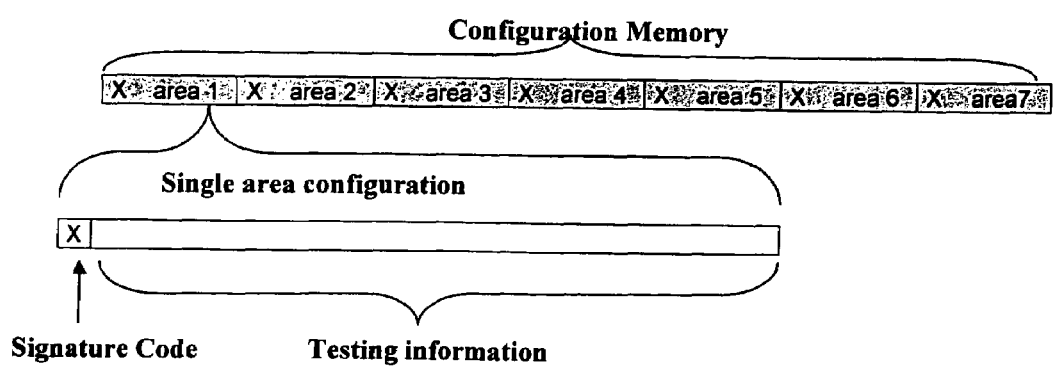
FIG. 2 is a bit diagram of the configuration memory in the embodiment of FIG. 1.

The organization of the configuration memory is illustrated in FIG. 2. In this particular example, the number of repairs which can be made in the memory array is six, and the configuration page is divided into seven areas, each of which has room for a signature code X and the configuration data or testing information. The signature code is only programmed into the area which contains the configuration data, and it serves as a pointer and verifies the validity of that data. The signature code is chosen to be unique so that it will not be confused with other code, and its size depends upon the size of the area and the amount of information that needs to be stored in the area. It is typically a minimum of 4 bits.

As illustrated in FIG. 1, the memory also includes configuration control logic 13 which reads the configuration data from the configuration page and delivers it to a latch 14 for the chip control and decoders which are represented generically by block 16.

Figure 3:
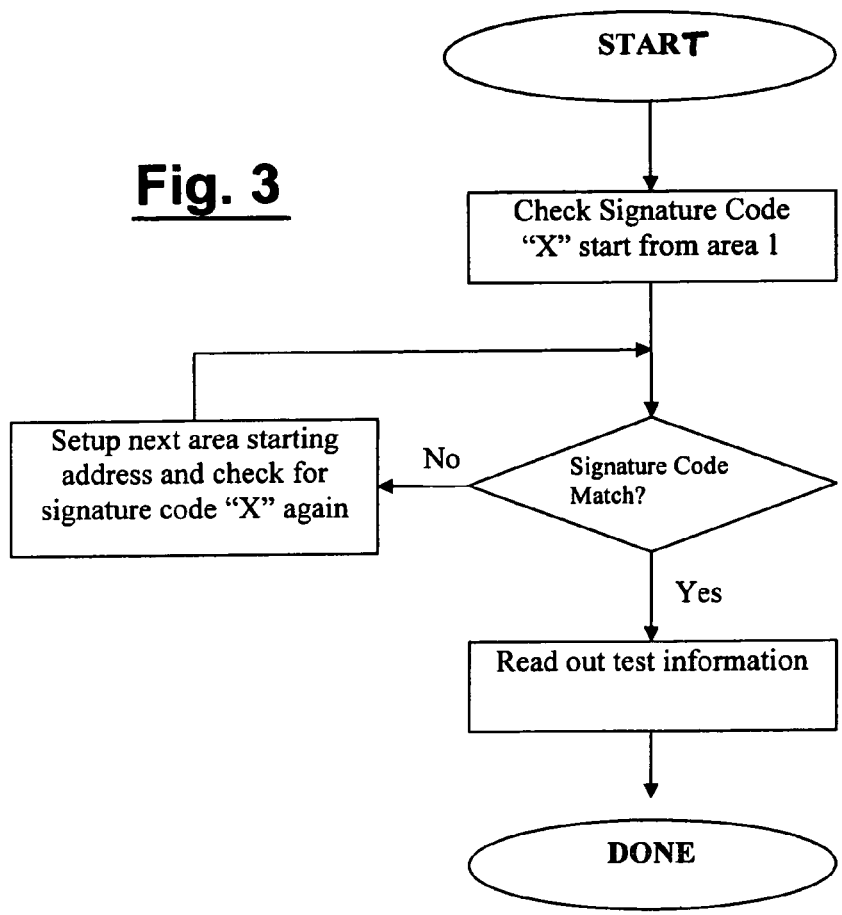
FIG. 3 is a flow chart of a routine for reading the configuration data out of the configuration memory of FIG. 2.

The manner in which the configuration data or test information is read out of the memory is illustrated in FIG. 3. Starting with the address assigned to the internal address of the first area (area 1 in the example of FIG. 2), that area is checked for the signature code. If the signature code is found, the configuration data or test information in the cells immediately following it is read out and used. If the signature code is not found, the next area is checked, and the process continues until the signature code is found. If no signature code is found at any of the starting addresses, then the logic control stops at the last one, and the area starting at that address is used as a default area until a valid signature code has been defined. That usually happens only with a new chip with no data in the memory array.

Figure 4:
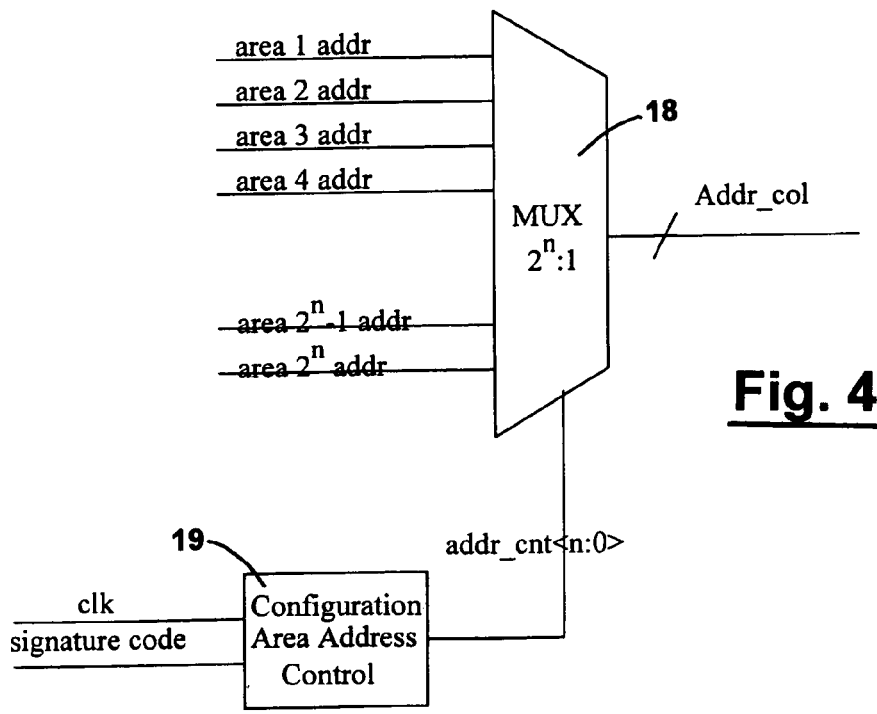
FIG. 4 is a block diagram of a circuit for addressing the configuration memory to locate the configuration data.

A circuit for addressing the configuration memory to locate the configuration data is illustrated in FIG. 4. This circuit includes an multiplexer 18 to which the starting address for each area is applied. Configuration area address control 19 steps the multiplexer through those addresses in response to a clock input, and when the signature code is found, it stops the multiplexer at that address. The address is applied to the address decoder for the memory, and the data following the signature code is delivered to the configuration latch 14 in FIG. 1.

Figure 5:
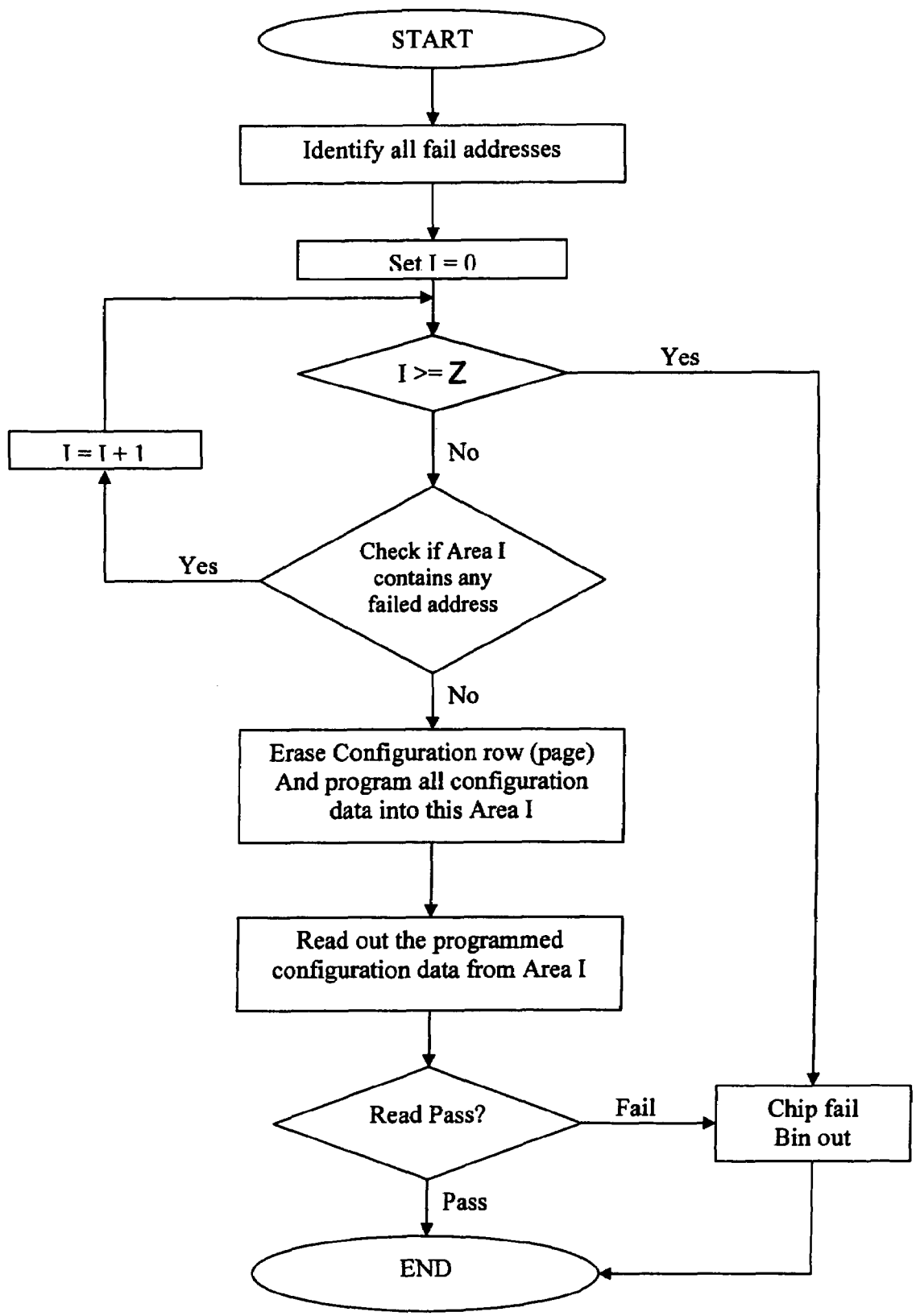
FIG. 5 is a flow chart of a routine for locating an area for storing configuration data in the configuration memory of FIG. 2.

Since the configuration data must be known and must be valid in order to configure the memory, the configuration data is stored in an area which contains no bad bits and does not need to be repaired. The manner in which this is done in one presently preferred embodiment is illustrated in FIG. 5. The entire memory array is first tested to identify all bad bits and the addresses at which they occur, and each area of the configuration memory is then checked for bad bits. This is done by setting an index I to zero and then testing the first area of the configuration memory for bad bits or a failed address. If a bad bit or failed address is found, the index is incremented and compared with the value Z which is the number of areas in the configuration memory. If an area I containing no bad bits is found, the entire configuration memory is erased, and the configuration data is programmed into the area with no bad bits. The data is then read out of that area, and if the read is successful, the program stops and the configuration data has been stored in an area which is known to be good.

If the count reaches Z and no good area has been found or if the data is not read successfully from an area in which it is stored, the chip is deemed to be defective and is discarded.

Alternatively, instead of using a configuration page which is divided into areas with predetermined starting addresses, the memory array can be searched for an area which does not need to be repaired, i.e. has no bad bits, and is large enough to store the configuration data and the signature code. If this is done, the configuration memory is scanned from the beginning until the signature code is found and the configuration data or test information can be read out. Although this process may have the disadvantage of taking longer to do the reading to find the signature code, it has the advantage of requiring a smaller page size than one which is divided into a plurality of areas with known addresses.

It is also possible to store the configuration data in a register which is outside the main memory. That register can either be divided into areas with known starting addresses, or it can have the signature code and configuration data stored in an another area of the array which is known to be good.

The invention has a number of important features and advantages, particularly when the configuration memory is part of the main memory array. In that case, the configuration or test information is programmed, erased and read in the same way as the rest of the array, and the configuration memory has the same quality and performance as the main array. It also eliminates the need to create a separate array outside the main memory for storing the configuration data.

It is apparent from the foregoing that a new and improved semiconductor memory and method of storing configuration data have been provided. While only certain presently preferred embodiments have been described in detail, as will be apparent to those familiar with the art, certain changes and modifications can be made without departing from the scope of the invention as defined by the following claims.

The invention claimed is:

1. A semiconductor memory with redundancy repair, comprising a main memory array, configuration data stored in an area of the array which is known to be unrepaired, and a signature code that verifies the validity of the configuration data and is stored in the unrepaired area as a pointer to the configuration data.

2. The semiconductor memory of claim 1 wherein the signature code is stored at a known address.

3. The semiconductor memory of claim 1 wherein the area in which the configuration data is stored is part of a configuration page having a plurality of areas which are known to be unrepaired and which can be utilized to store repair information during testing of the memory, the number of areas in the configuration page being greater than the number of repairs permitted to be made in the memory array.

4. A semiconductor memory with redundancy repair, comprising a main memory array, a configuration page divided into a plurality of storage areas, data for configuration of the memory stored in one of the storage areas which has been tested and found to be free of bad bits, and a signature code stored with the configuration data in the area which is free of bad bits.

5. The semiconductor memory of claim 4 wherein the number of storage areas in the configuration page is greater than the number of repairs permitted to be made in the memory array.

6. The semiconductor memory of claim 4 wherein each of the storage areas starts at a known address of the memory array.

7. A method of storing configuration data for a semiconductor memory in which defective areas of a main memory array are repaired redundantly, comprising the steps of: identifying an area of the main memory array which has not been repaired, storing configuration data for the memory in the unrepaired area, and storing a signature code that verifies the validity of the configuration data in the unrepaired area as a pointer to the configuration data.

8. The method of claim 7 wherein the signature code is stored at a known address in the memory array.

9. A method of storing configuration data for a semiconductor memory in which defective areas of a main memory array are repaired redundantly, comprising the steps of: setting up a configuration page in the main memory array, with the configuration page being divided into a plurality of areas of equal size and known starting addresses, testing the areas in the configuration page to identify an area which is free of bad bits, storing configuration data in the area which is free of bad bits, and storing a signature code in the area of the configuration rage with the configuration data.

10. The method of claim 9 including the step of erasing the configuration page before storing the configuration data.

11. A method of configuring a semiconductor memory in which defective areas of a main memory array are repaired redundantly, the steps of: setting up a configuration page in the main memory array, with the configuration page being divided into a plurality of areas with known starting addresses, storing configuration data in one of the areas of the configuration page which is known to be free of bad bits, storing a signature code in the area of the configuration page with the configuration data, addressing the areas of the configuration page until the signature code is found, and reading the configuration data from the area where the signature code is found.

12. The method of claim 11 wherein the areas of the configuration page are of equal size.

13. The method of claim 11 including the step of storing repair information as repairs are made.

14. A configuration memory for a semiconductor memory having a main memory array which can be redundantly repaired, comprising: a configuration page divided into a plurality of storage areas of equal size and known starting addresses, configuration data stored in one of the areas which is known to be free of bad bits, and a signature code stored in the area with the configuration data for verifying the validity of the configuration data.

15. The configuration memory of claim 14 wherein the configuration page is an integral part of the main memory array.

* * * * *